United States Patent [19]
Arnold et al.

[11] Patent Number: 5,747,802
[45] Date of Patent: May 5, 1998

[54] AUTOMATED NON-VISUAL METHOD OF LOCATING PERIODICALLY ARRANGED SUB-MICRON OBJECTS

[75] Inventors: Norbert Arnold, New Hempstead; Klaus Hummler; Ernest Levine, both of Poughkeepsie, all of N.Y.; Rainer Weiland, Flintsbach, Germany

[73] Assignees: Siemens Aktiengesellschaft; International Business Machines Corporation

[21] Appl. No.: 626,192

[22] Filed: Mar. 29, 1996

[51] Int. Cl.$^6$ .............................. G01N 23/00; H01J 37/00
[52] U.S. Cl. ................................ 250/307; 250/491.1
[58] Field of Search ........................... 250/307, 309, 250/310, 491.1

[56] References Cited

U.S. PATENT DOCUMENTS

| | | | |
|---|---|---|---|
| 4,791,302 | 12/1988 | Nozue | 250/491.1 |
| 4,885,472 | 12/1989 | Young | 250/491.1 |
| 5,136,169 | 8/1992 | Smith et al. | 250/491.1 |

*Primary Examiner*—Bruce Anderson
*Attorney, Agent, or Firm*—Donald B. Paschburg

[57] ABSTRACT

A method is disclosed for locating a particular small objects (down to submicron) within an array of periodically arranged like objects utilizing a scanning tool. The method includes scanning the array for generating a plurality of pulses, which correspond to these objects contained within the array. Counting the plurality of pulses in order to locate the particular object within the array.

20 Claims, 3 Drawing Sheets

AUTOMATED NON-VISUAL METHOD OF LOCATING PERIODICALLY ARRANGED SUB-MICRON OBJECTS

BACKGROUND OF THE INVENTION

1. Field of the Invention

The present invention relates generally to a manufacturing process and more particularly, to an automatic and non-visual method for accurately locating small (micron to submicron) objects in a periodic arrangement.

2. Description of the Prior Art

Modern technology has enabled objects such as electrical devices to be produced in ever shrinking dimensions. Such objects as Dynamic Random Access Memory (DRAM) cells are being produced today in sub-micron sizes or dimensions. Very often these very small objects are utilized in groups of large numbers known as arrays. These arrays are often arranged and mounted to a flat surface known as a wafer. The arrays are usually arranged in a periodic order so that each object has a unique X-Y location on the wafer. Referring to FIG. 1, there is shown an example of a periodically arranged array of sub-micron objects. This example represents a large scale array which can contain thousands of objects, wherein each dot represents a sub-micron object and the dashes represent a continuation of these objects. As can be seen, each of the objects are arranged periodically on the wafer 12 so that it has a unique X-Y location.

During the manufacturing process or physical analysis of these arrays, the individual objects often have to be located in order to perform imaging, microsurgery, repairs or marking etc. Locating the particular object to be worked on requires finding the exact X-Y location within the array. This often can be a difficult task to perform due to the large number and very small size of these objects. In fact, only very precise instruments such as a scanning electron microscope or a focused ion beam tool are able to accurately locate the X-Y location of an individual object within such an array, as will be described later.

A scanning electron microscope includes electromagnetic lenses utilized to form the electron probe, scan coils that sweep the beam over the sample, a detector, an amplifier and a cathode ray tube. The Scanning Electron Microscope operates by bombarding the surface of the sample with a fine probe of electrons, generally less than a 100 Angstroms. The sample emits secondary electrons which are generated by the action of the primary beam. The secondary electrons are collected by the detector and then amplified. The amplified secondary electrons are further fed to the cathode ray tube to generate an image of the sample.

The focused ion beam instrument operates similarly to the scanning electron microscope in that it generates an image by bombarding the sample with a stream of matter, where in the case of a focused ion beam the stream of matter is an ion beam. Both the focused ion beam and scanning electron microscope are equipped today with more or less precise manual or motor stages. The stages of these instruments support and move the sample, enabling the ion or electron beam of these instruments to scan the sample. The focused ion beam and scanning electron microscope are both capable of producing a visual image or a linear graphical signal of the sample. The visual image is defined by a plurality of scan lines, while the linear graphical signal is defined by a single scan line.

As mentioned earlier, an instrument such as a scanning electron microscope or a focused ion beam tool is presently utilized to locate the X-Y location of a particular sub-micron device in an array, as described earlier. The site of interest in the array is located by moving the stage of the instrument in the X and/or Y direction and simultaneously visually counting the devices passing through the imaging field of the device. Visually counting to the site of interest is a very time consuming and unreliable method. Very often the counting has to be repeated two or three times to the same site of interest to ensure that is reproducibly found. Thus, the present procedure is expensive in terms of tool and human resources, and also inaccurate.

The problem of accurately locating a device in array is not easily solved by other methods. For example, this problem cannot be solved by utilizing a high precision motor stage and measuring the distance to the device of interest because an accurate enough stage, if available, would be prohibitively expensive. The use of a computer aided full pattern recognition system would also be very expensive and not feasible because the occurring patterns (especially during the unlayering procedure for the physical analysis of the devices) are not fully predictable.

It is therefore, an object of the present invention to provide a relatively inexpensive method for accurately locating sub-micron objects within a periodically arranged array.

SUMMARY OF THE INVENTION

A method is disclosed for locating a particular very small (down to submicron) object within an array of periodically arranged like objects utilizing a scanning tool. The method includes scanning the array for generating a plurality of pulses, which correspond to the sub-micron objects contained within the array. Counting the plurality of pulses in order to locate the particular object within the array.

A system is also disclosed for locating a particular like object within an array of periodically arranged like objects. The system including a scanning tool for scanning the array in order to generate a plurality of pulses that correspond to the sub-micron objects within the array. A means for counting the plurality of pulses in order to locate the particular object within the array.

BRIEF DESCRIPTION OF THE DRAWING

The above objects, further features and advantages of the present invention are described in detail below in conjunction with the drawings, of which.

DETAILED DESCRIPTION OF THE DRAWING

Figure 1:
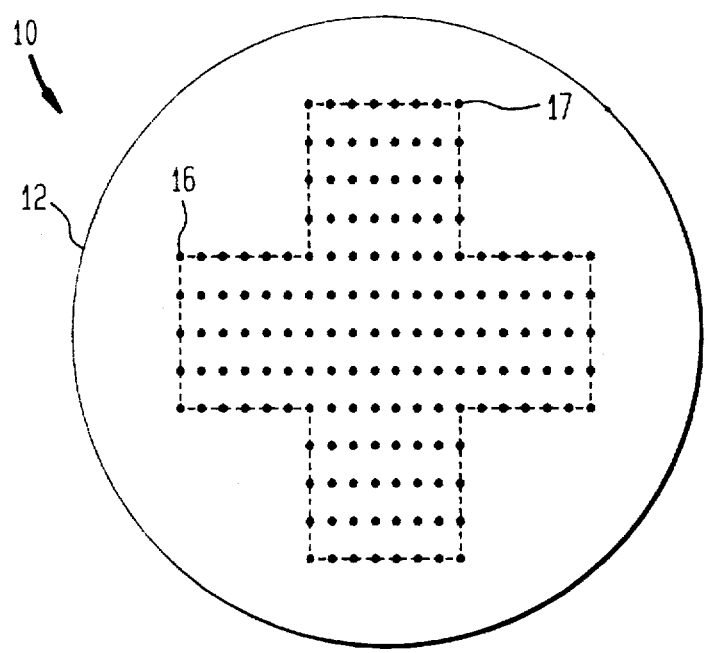
FIG. 1 is an example of an array of periodically arranged sub-micron objects.

The present invention is directed to a method for accurately locating very small (down to submicron) objects in a periodically arranged array. An example of such a periodically arranged array is shown in FIG. 1. The displayed array 10 consists of a plurality of sub-micron objects mounted to a wafer 12 in a periodic arrangement, so that each object has a unique X-Y location. The objects could be mounted on any planar surface. The above described example is of the type commonly utilized in the field of electrical devices. Although, the present invention has great utility in the electrical device field, it should be noted that it is not limited to any particular field of use. The present invention can be utilized to locate any type of small (down to submicron) object arranged periodically in an array.

The method of the present invention locates a particular sub-micron object in the array 10 by counting the number of objects in both the X and Y direction from a predetermined position 16. The counting is accomplished by first generating a plurality of pulses that correspond to the objects encountered in the X and/or Y direction of the array. The location of the particular object 14 is then determined by counting the number of pulses in both directions, which corresponds to the desired location of the particular object 14.

Figure 2:
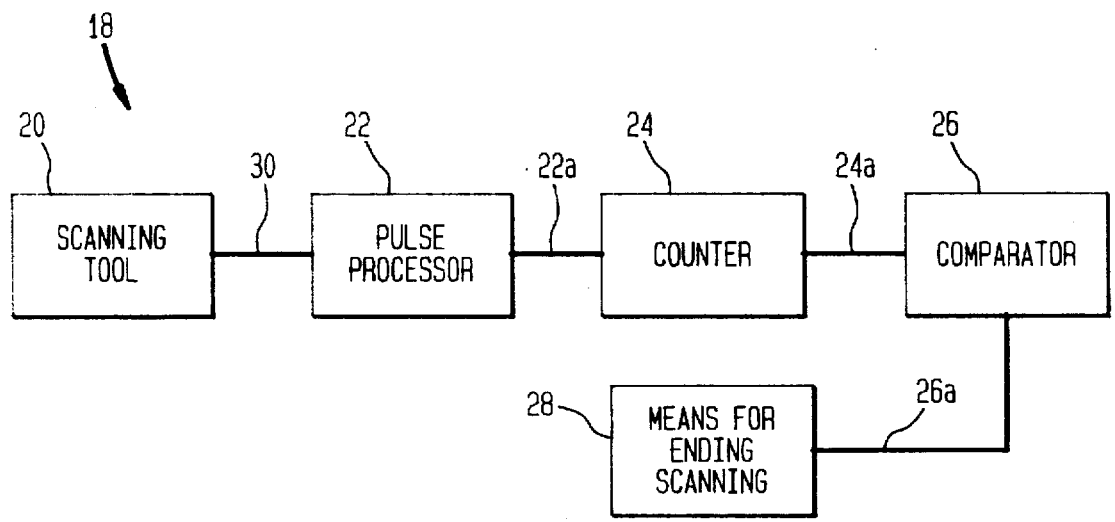
FIG. 2 is a block diagram of the equipment utilized in the method according to the present invention.

Referring to FIG. 2, a block diagram of the equipment utilized 18 in the method according to the present invention is shown. The first piece of equipment utilized by the present invention is a scanning tool 20. The scanning tool 20 is utilized to generate the pulses 30 that correspond to the plurality of sub-micron objects encountered within the array.

The scanning tool 20 is embodied by either a scanning electron microscope or a focus ion beam instrument. It could also be a scanning optical beam (laser) for larger objects. In the present invention, either instrument is utilized in the linear graphical mode in order to produce the pulses 30 in both the X and Y direction of the array as previously discussed. In the linear graphical mode, either instrument scans the object of interest along a single line and the signal picked up along this line is displayed on the screen. The signal displayed is an electrical signal having an amplitude that is proportional to the intensity of the secondary electrons produced by the object of interest.

Figure 3:
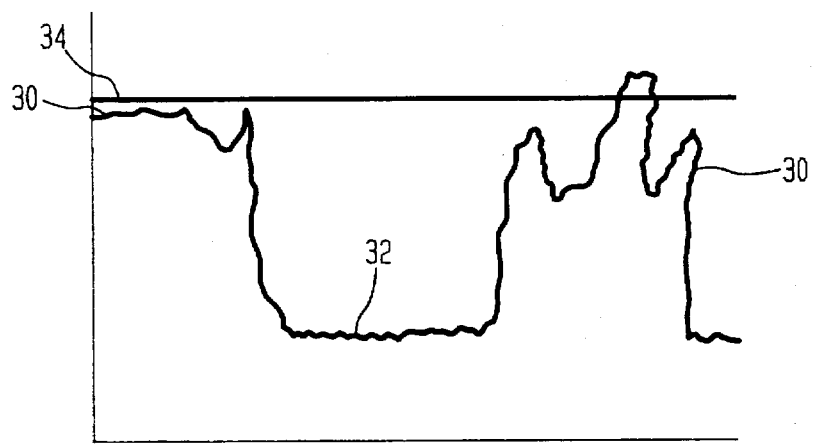
FIG. 3 is a wave form diagram of a series of pulses generated by a scanning tool according to the present invention.
Figure 4:
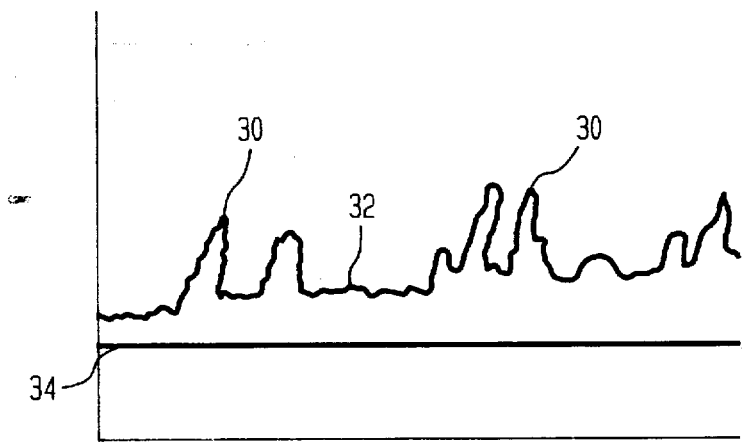
FIG. 4 is another wave form diagram of a series of pulses generated by a scanning tool according to the present invention.
Figure 5:
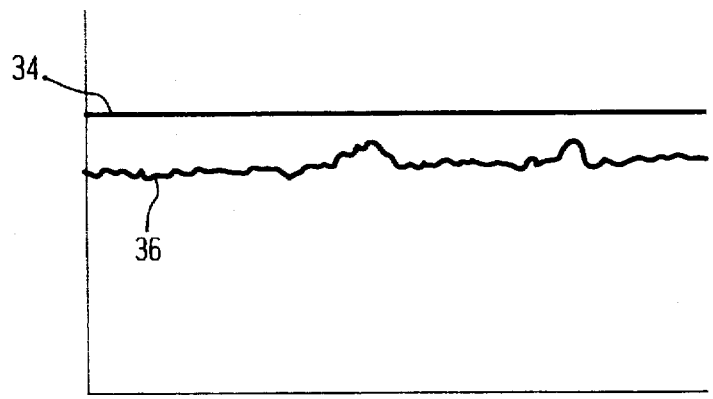
FIG. 5 is a wave form diagram of a noise level generated by a scanning tool according to the present invention.

Referring to FIGS. 3 & 4 there is shown examples of wave forms produced by either instrument in the linear graphical mode according to the present invention. These wave forms were generated by scanning an array of submicron objects as shown in FIG. 2. As can be seen from FIGS. 3 & 4, a periodic signal is produced which has well defined peaks or pulses 30, which are well above the noise level 36 as shown in FIG. 5. The pulses 30 correspond to the objects within an array, while the low points 32 correspond to spaces between the objects. The solid line 34 corresponds to the line along which the linear graphical signal is acquired. It should also be noted that the logic level produced by either of these types of instruments is a standard 5 volts, which makes the pulses 30 compatible with digital circuitry such as a counter.

Today, scanning electron microscopes and focus ion beam instruments are more or less equipped with precise manual or motor driven stages. The stage supports and moves the object of interest while it is being scanned by the beam of these instruments. The manual stages usually have vernier knobs which enable a user to move the stage in either the X or Y direction. While the motor driven stages have corresponding stepper models for moving the stage in either the X or Y direction.

The method of the present invention contemplates utilizing an instrument having either a manual or motor driven stage. Both types of stages are capable of moving an array in a precise enough manner so that it can be accurately scanned and then stopped at the right time. However, the best results are achieved with a scanning electron microscope or focus ion beam instrument utilizing a motor driven stage.

Referring back to FIG. 2, the pulses 30 generated by the scanning tool 20 are then coupled to a pulse processor 22. The pulse processor 20 ensures that only the pulses 30 that corresponds to an actual object within the array is recognized or counted. Contaminating particles located between the objects of the array can cause false pulses to be generated. The false pulses are eliminated by exploiting the periodicity of the pulses along the scan line and not accepting any pulse in between two real objects within the array. The periodicity of the pulses are utilized by defining windows along the scan line of the stage in which pulses to be counted are accepted. If a pulse is within such a window it will be accepted, if the pulse is outside such a window it will be rejected. The frequency ($f_w$) of such windows is calculated by:

$$f_w = (S_s N)/L_a \qquad (1)$$

where $S_s$=the speed of the stage

N=the number of objects in a given direction of the array.

$L_A$=the length of the array in a given direction.

A high precision stage can be used in two ways: 1) The length measurement of the stage can be used to define the above mentioned windows in which input is accepted. 2) The pulses generated by the objects together with the known distance of the objects can be used to correct for the inaccuracy of the length measurement of the stage. In this case, basically, the object is found by a length measurement using the high precision stage (the inaccuracy of the stage being corrected by the pulses). In the case of large Contaminating particles, the pulse processor 22 aborts accepting the pulses and an operator manually chooses another X-Y direction to generate pulses along. However, such large particles are unlikely to occur in a good manufacturing process or in a good physical analysis procedure.

The pulse processor 22 further includes filtering the pulses 30 generated by the scanning tool 20. The filtering converts the pulses into a rectangular signal utilizing the slope and height of the pulses. Such a conversion enables the output of the scanning tool 20 to be more easily recognized by digital circuitry such as a counter. Such filtering is well known and is accomplished by utilizing such circuits as a limiter, a schmidt trigger etc.

The processed pulses 22A are then coupled to a counter 24. The counter 24 generates a count 24A of the pulses received, wherein a particular count corresponds to the number of objects encountered by the scanning tool 20 in the X and/or Y direction. This enables the present invention to keep track of the position of the scanning tool 20 in an array. The pulse counts 24A are then coupled to a comparator 26. The comparator 26 compares the pulse counts 24A as they are generated to a predetermined number, which corresponds to the location of the particular sub-micron object to be located in either the X or Y direction of the array. When the count 24A equals the predetermined number, the comparator generates an end scanning signal 26A, which ends the movement of the stage, or the counting. It should be understood to one skilled in the art that utilizing a counter and comparator is only one of a number of ways to practice the present invention. For example, the comparator 26 can be eliminated if a programmable counter is utilized. Such a counter eliminates the need for the comparator 26 because it can be programmed to count to a predetermined count corresponding to the location of an object within the array.

The counter 24 and comparator 26 are preferably embodied as seperate digital circuits or as software functions within a microprocessor. This will enable the method of the present invention to automatically as well as non-visually locate a particular small object within an array.

The end scanning signal 26A is then coupled to a means for ending the scanning 28. In the case of a scanning tool 20 with a manual stage, the end scanning means 28 is embodied as an indicating device such as a light or buzzer which alerts the operator to stop moving the stage. While in the case of a scanning tool 20 with a motor driven stage, the ending scanning means 28 is embodied as a switching circuit that simply cuts power to the motors driving the stage. As previously mentioned, the scanning tools include either a manual or motor driven stage, which is capable of moving an array in a very precise and slow manner. Therefore, enough time is provided to stop the scanning tool 20 before it passes the particular object in the array to be located. Otherwise the light could be switched on two or three objects before reading the actual object, or the motors of the stage could be slowed down shortly before the object is read.

Figure 6:
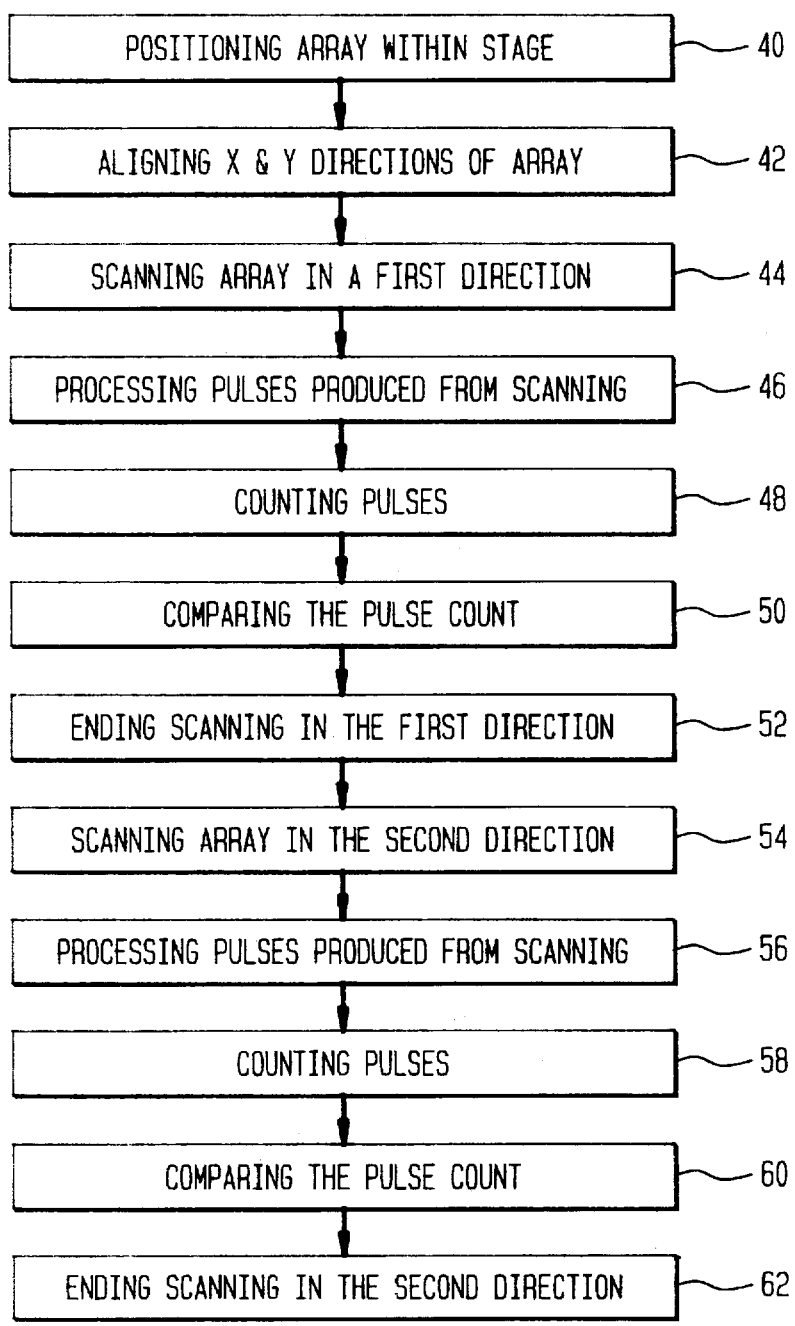
FIG. 6 is a flow diagram of the method for locating periodically arranged sub-micron objects according to the present invention.

Referring to FIG. 6, a flow diagram of the method for locating periodically arranged sub-micron objects 38 according to the present invention is shown. The first step in the method 38 involves positioning an array within the stage of the scanning tool 40. The array is positioned within the stage so that the scanning tool begins to scan from a predetermined location within the array. Thus, any other object in the array is located by moving in the X and/or Y direction from this location.

After the positioning step 40, the X & Y directions of the array are aligned with the beam of the scanning tool 42 and the X & Y directions of the movement of the stage. The stage and the direction of the scanning beam can be rotated independently. The alignment is necessary in order to prevent the lose of the signal or pulses while the array is being scanned. It has been demonstrated that even with a manual stage, such an alignment is easily achieved, so that over a distance of several hundred microns the deviation in the direction perpendicular to the direction scanning is small enough not to lose the signal.

If an automated alignment is not available, the alignment (manual and motor driven) is done by moving the stage X (Y) direction and observing the deviation in Y (X) direction over a long distance. The stage is rotated until no deviation perpendicular to the direction of the stage movement is observed. While in a motor driven stage, the alignment is accomplished automatically by the scanning tool. Many of the motor driven scanning electron microscopes and focused ion beam instruments have the capability to automatically align objects to the scanning beam. These instruments accomplish this by rotating the stage by an additional motor until a software function within the instrument determines the array is aligned.

After the alignment step 42, the array is then scanned in a first direction 44. This is accomplished by activating the scanning beam of the scanning tool and then moving the stage in either the X or Y direction. This causes the scanning tool to generate pulses which correspond to the objects encountered by the scanning tool while scanning in the first direction of the array.

The configuration of the array determines which direction of the array is scanned first. For an array having a rectangular or square configuration, it does not matter which direction is scanned first.

However, for an array having an irregular configuration as shown in FIG. 1, it does matter which direction is scanned first. In order to locate the object 17 by starting from the predetermined position 16, it is obvious from FIG. 1 that the first direction to be scanned has to be the X direction. If the first direction to be scanned is the Y direction, the scanning tool would not encounter any objects to generate pulses from. This would make the method of the present invention inoperable because there would be no pulses to count.

Referring back to FIG. 6, while scanning the array in the first direction 44 the pulses produced are then processed 46. As previously discussed the processing 46 includes eliminating false pulses that do not correspond to real sub-micron objects in the array. The processing 46 also includes filtering that converts the pulses into a rectangular signal.

The processing 46 further includes electronically or manually adjusting the alignment of the scanning tool in order to compensate for deviations of the stage, which ensures that the pulses have a maximum peak. This is accomplished by comparing the pulse amplitudes to a predetermined threshold and when the pulse amplitudes fall below this threshold, an alignment sequence is initiated within the scanning tool. The alignment sequence could be that the stage of the scan line is moved perpendicular to the present direction of counting until maximum peak height is achieved again (with the stage being stopped or moving).

The processed pulses are then counted 48, which generates a pulse count indicating the number of objects encountered by the scanning tool within the array. During the counting step 48, the pulse counts generated are also compared to a predetermined number, which corresponds to the location of the particular object in the first direction of the array. The comparing step 50 is continued until the pulse count equals the predetermined number, which means that the scanning tool has reached the location of the particular object to be located in the first direction of the array.

The counting and comparing steps 50,52 are preferably performed by an electronic means as previously discussed. However, the method of the invention has been successfully practiced by a user visually counting and comparing the pulses as viewed from the display of the scanning tool. This demonstration of the invention was performed utilizing a Hitachi SEM as the scanning tool.

When the pulse count equals the predetermined number, the scanning in the first direction ends 52. This step 52 is accomplished in a manual stage configuration by a user ending the turning of the vernier knob associated with the first direction. In a motor driven stage, this step 52 is accomplished by cutting of the power to the motor driving the stage in the first direction.

After ending the scanning in the first direction 52, the scanning tool will begin scanning the array in a second direction 54. The second direction is either the X or Y direction, which was not taken by the scanning tool when it scanned in the first direction 44. This step 54 generates pulses corresponding to the objects encountered by the scanning tool in the second direction of the array. The pulses generated are again processed 56, counted 58 and then compared 60 as previously described for steps 46, 48 & 50.

In the comparing step 60, the pulse counts corresponding to the objects encountered in the second direction are compared to a predetermined number, which corresponds to the location of the particular object in the second direction of the array. The comparing step 60 is performed until the pulse count equals the predetermined number corresponding to the second direction, which means the scanning tool has also reached the location of the particular object in the second direction of the array. At this time the scanning in the second direction ends 62 because the particular object in the array is located.

The present invention is also capable of being configured to eliminate the ending scanning step 62. This enables the present invention to continually scan in order to locate a number of objects within the array.

While the invention has been particularly shown and described with reference to preferred embodiments thereof, it will be understood by those skilled in the art that changes in form and details may be made therein without departing from the spirit and scope of the present invention.

What is claimed is:

1. A method for locating a particular sub-micron object within an array of periodically arranged sub-micron objects utilizing a scanning tool operating in a linear graphical mode, said method comprising the steps of:

scanning the array with said scanning tool for generating a plurality of pulses that correspond to the sub-micron objects contained within the array; and counting said plurality of pulses in order to locate the particular object within the array.

2. The method of claim 1, wherein said scanning tool is an instrument selected from the group consisting of a scanning electron microscope, a focused ion beam tool and an optical beam (laser).

3. The method of claim 1, which further includes aligning the array with the scanning tool before said scanning step in order to prevent the loss of a signal.

4. The method of claim 1, which further includes processing said plurality of pulses in order to eliminate false pulses, before said counting step.

5. The method of claim 4, wherein said false pulses are eliminated by defining a window in which pulses to be counted are only accepted.

6. The method of claim 4, wherein said processing step further includes filtering said plurality of pulses to convert said plurality of pulses into a rectangular signal.

7. The method of claim 4, wherein said processing step further includes comparing amplitudes of said plurality of pulses to a predetermined threshold in order to initiate an alignment sequence within the scanning tool when said amplitudes fall below said predetermined threshold.

8. The method of claim 1, wherein said counting step is accomplished electronically.

9. The method of claim 8, wherein said counting step generates a series of counts, comparing said series of counts to a predetermined number in order to locate the particular object within the array.

10. The method of claim 1, wherein said scanning starts from a predetermined location.

11. A method for locating a particular sub-micron object within an array of periodically arranged sub-micron objects utilizing a scanning tool operating in a linear graphical mode, said method comprising the steps of:

scanning the array in a first direction with said scanning tool for generating a plurality of pulses that correspond to the sub-micron objects in said first direction of the array; and counting said plurality of pulses in order to locate the particular object in said first direction of the array.

12. The method of claim 11, which further includes after said counting step:

scanning the array in a second direction with said scanning tool for generating a second plurality of pulses that correspond to the sub-micron objects in said second direction of the array; and counting said second plurality of pulses in order to locate the particular object in said second direction of the array.

13. The method of claim 12, wherein said first direction and said second direction are perpendicular.

14. The method of claim 13, wherein said scanning tool is an instrument selected from the group consisting of a scanning electron microscope, a focused ion beam tool and an optical beam (laser).

15. The method of claim 14, which further includes processing both said plurality of pulses and said second plurality of pulses in order to eliminate false pulses, before each said counting step.

16. The method of claim 15, wherein s aid false pulses are eliminated by defining a window in which pulses to be counted are only accepted.

17. The method of claim 16, wherein both said counting steps are accomplished electronically.

18. The method of claim 17, wherein both said counting steps generate a series of counts, comparing both said series of counts to a predetermined number in order to locate the particular object within the array.

19. A system for locating a particular sub-micron object within an array of periodically arranged sub-micron objects, comprising:

a scanning tool for scanning the array in order to generate a plurality of pulses that correspond to the sub-micron objects within the array; and means for counting said plurality of pulses in order to locate the particular object within the array.

20. The system of claim 19, wherein said scanning tool is an instrument selected from the group consisting of a scanning electron microscope, a focused ion beam tool and an optical beam (laser).

* * * * *

UNITED STATES PATENT AND TRADEMARK OFFICE
CERTIFICATE OF CORRECTION

PATENT NO.  : 5,747,802
DATED       : May 5, 1998
INVENTOR(S) : Arnold et al.

It is certified that error appears in the above-indentified patent and that said Letters Patent is hereby corrected as shown below:

On the cover page, at Item [73], following "Siemens Aktiengesellschaft" insert --Munich, Germany--; and
following "International Business Machines Corporation" insert --Armonk, New York--.

Signed and Sealed this

Thirtieth Day of November, 1999

Attest:

Q. TODD DICKINSON

Attesting Officer

Acting Commissioner of Patents and Trademarks